(12) United States Patent
Zhu et al.

(10) Patent No.: US 10,048,714 B2
(45) Date of Patent: Aug. 14, 2018

(54) CURRENT SOURCE CALIBRATION TRACKING TEMPERATURE AND BIAS CURRENT

(71) Applicant: ANALOG DEVICES, INC., Norwood, MA (US)

(72) Inventors: Haiyang Zhu, Wilmington, MA (US); Wenhua W. Yang, North Andover, MA (US); Nathan T. Egan, Burlington, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 75 days.

(21) Appl. No.: 14/169,986

(22) Filed: Jan. 31, 2014

(65) Prior Publication Data
US 2015/0220100 A1     Aug. 6, 2015

(51) Int. Cl.
| | |
|---|---|
| *G05F 1/10* | (2006.01) |
| *G05F 3/02* | (2006.01) |
| *H03M 1/10* | (2006.01) |
| *H03M 1/74* | (2006.01) |

(52) U.S. Cl.
CPC ............ *G05F 3/02* (2013.01); *H03M 1/1009* (2013.01); *H03M 1/1019* (2013.01); *H03M 1/742* (2013.01)

(58) Field of Classification Search
CPC .... H03M 1/747; H03M 1/687; H03M 1/1061; H03M 1/742; H03M 1/745
See application file for complete search history.

(56) References Cited

U.S. PATENT DOCUMENTS

| | | |
|---|---|---|
| 5,621,355 A | 4/1997 | Williams et al. |
| 6,459,293 B1 | 10/2002 | Keshavarzi et al. |

(Continued)

FOREIGN PATENT DOCUMENTS

EP     0561099     9/1993

OTHER PUBLICATIONS

Elbert Bechthum, A novel temperature and disturbance insensitive DAC calibration method, DOI: 10.1109/ISCAS.2011.5937988.*

(Continued)

*Primary Examiner* — Sibin Chen
(74) *Attorney, Agent, or Firm* — Patent Capital Group

(57) ABSTRACT

In an example embodiment, a circuit is provided that includes a current source with a calibrated trim circuit whose output current varies with transconductance of the current source, and tracks a current mismatch between the current source and another current source under varying bias currents and temperatures. The trim circuit may include at least one calibration digital to analog converter (CAL DAC), which may be driven by a bias circuit generating current proportional to the transconductance of the current source. In an example embodiment, the trim circuit may include at least two CAL DACs, whose output current may vary with bias current only, and with bias current and temperature. A method to calibrate the CAL DACs includes varying calibration settings of the CAL DACs under different bias currents until the output current of the trim circuit substantially accurately tracks the current mismatch under disparate bias currents and temperatures.

20 Claims, 11 Drawing Sheets

(56) References Cited

U.S. PATENT DOCUMENTS

| | | | | |
|---|---|---|---|---|
| 6,507,296 B1 * | 1/2003 | Lee | .................... | H03M 1/1004 |
| | | | | 341/120 |
| 6,583,740 B2 | 6/2003 | Schofield | | |
| 6,822,505 B1 | 11/2004 | Palaskas et al. | | |
| 7,102,342 B2 | 9/2006 | Kim | | |
| 8,031,098 B1 * | 10/2011 | Ebner | ................. | H03M 1/1061 |
| | | | | 341/144 |
| 8,576,101 B1 * | 11/2013 | Lin | .................... | H03M 1/1042 |
| | | | | 341/118 |
| 2012/0245879 A1 | 9/2012 | Mikkola | | |

OTHER PUBLICATIONS

Kumar Parthasarathy et al., "A 16-bit Resistor String DAC with Full-Calibration at Final Test," International Test Conference, 0-7803-9039-3/$20.00 © 2005 IEEE, Paper 4.2, 10 pages.

Elbert Bechthum et al., "A temperature and disturbance insensitive calibration method for high speed Digital to Analog Converters," 6 pages.

European Search Report issued in EP Patent Application Serial No. 15151969.1 dated Jul. 28, 2015, 11 pages.

Response to European Search Report in EP Patent Application Serial No. 15151969.1 filed Feb. 22, 2016, 21 pages.

OA1 issued in CN Patent Application Serial No. 201510048292.0 dated Dec. 24, 2015, 13 pages.

Georgi I. Radulov et al., "An on-chip self-calibration method for current mismatch in D/A converters", Proceedings of ESSCIRC, Grenoble, France, 2005, 4 pages.

OA1 issued in EP Patent Application Serial No. 15151969.1 dated Nov. 8, 2017, 7 pages.

* cited by examiner

CURRENT SOURCE CALIBRATION TRACKING TEMPERATURE AND BIAS CURRENT

TECHNICAL FIELD OF THE DISCLOSURE

The present disclosure relates generally to electrical circuits and, more particularly, to a method and apparatus for current source calibration tracking temperature and bias current.

BACKGROUND

It is important in many electrical circuits that various current sources maintain stable and fixed current output relative to one another. In an example, a current steering digital to analog converter (DAC) includes a plurality of current sources. The relative mismatches between the current sources with varying operating conditions can directly affect linearity of the DAC. As used herein, a "current source" comprises an electrical circuit that delivers current (e.g., electric current), which is ideally independent of the voltage across it (i.e., the current source). In practice, current sources have non-idealities, such as finite internal resistance, which can cause the current source to deviate from ideal behavior. In general, active current sources may be implemented using active electronic components (e.g., transistors) having current-stable nonlinear output characteristics when driven by steady input current or voltage.

Mechanisms to decrease the mismatch between the various current sources can include a calibration technique that trims (e.g., calibrates, adjusts, regulates, etc.) all current sources to a reference current source using a trim circuit. In one example mechanism, the trim circuit includes a calibration DAC (CAL DAC), which injects a small correction current in parallel with the current source under calibration (or correction). The total current of the current source and the trim circuit is measured against a master reference current and the difference is forced to approach zero through a successive approximation register (SAR) logic circuit.

However, the output current generated by the CAL-DAC does not generally track environment changes, such as temperature and bias current changes. Bias current refers to a direct current (DC) that is made to flow between two points of an active electronic component for purposes of controlling its behavior. Assume that the current source comprises a metal oxide semiconductor field effect transistor (MOSFET), which can be either of NMOS type, or PMOS type. The bias current (I) to voltage (V) relationship of the current source follows a square law:

$$I = \frac{\mu C_{ox}}{2} \frac{W}{L}(V_{GS} - V_{TH})^2 = \beta(V_{GS} - V_{TH})^2$$

where $\mu$ is the electron or hole mobility (depending on the transistor type), $C_{ox}$ is gate capacitance of the transistors, W and L are width and length, respectively, of the gate, $V_{GS}$ is the voltage between the gate and source of the transistor, and $V_{TH}$ is the threshold voltage. The current mismatch $\Delta I$ between the reference current source and the current source to be calibrated can be expressed as follows:

$$\Delta I = \frac{\Delta \beta}{\beta} I - g_m \Delta V_{TH}$$

where $$g_m = \sqrt{2 \mu C_{ox} \frac{W}{L} I},$$

is transconductance of the transistor. In a general sense, transconductance is a ratio of a current change at an output port of the transistor (e.g., MOSFET) to a voltage change at an input port of the transistor.

In general, $$\frac{\Delta \beta}{\beta},$$

$\Delta V_{TH}$, I, and $g_m$ determine the current mismatch, where $$\frac{\Delta \beta}{\beta}$$

and $\Delta V_{TH}$ are device mismatches (e.g., caused due to processing and other factors) between the current source under calibration and the reference current source. In general, $g_m$ is temperature and bias current dependent (e.g., because mobility $\mu$ is a function of temperature, and $g_m$ varies with the bias current). Therefore, the current mismatch as a function of I and T can be expressed as:

$$\Delta I(I, T) = \frac{\Delta \beta}{\beta} I - g_m(I, T) \Delta V_{TH}$$

The full scale current (e.g., maximum value of current) of currently existing CAL DACs is only proportional to bias current I. The output of the CAL DAC is a portion of the full scale current based on a fixed (e.g., constant) scale factor. Usually the current source is calibrated under a certain environment, including a specific temperature and bias current. When the environment such as the bias current and temperature change, the output current of the CAL-DAC trim circuit does not track the current source mismatch. As a result, although the current source may be calibrated to match the master reference current, the calibration can become erroneous with changes in temperature or bias current; consequently, the current sources fail to maintain stable and fixed current output relative to one another. Recalibration of each current source would be required in the changed environment.

Overview

The present disclosure relates generally to a trim circuit and a calibration method to facilitate current source calibration with changing temperatures and bias currents. In an example embodiment, a trim circuit is provided whose output current changes with the bias current and temperature, tracking current mismatch between two current sources (e.g., a reference current source and a current source under calibration) under varying environmental conditions (e.g., bias current and temperature).

In an example embodiment, the trim circuit may include a single CAL DAC whose output changes with bias current and temperature and tracks the current mismatch. In another example embodiment, the trim circuit can include multiple CAL DACs whose outputs change with bias current and temperature and tracks the current mismatch. In an example embodiment, the calibration method includes determining calibration settings of the CAL DACs through multiple measurements under different bias current and/or temperature conditions. Some embodiments may also include a circuit that generates current proportional to a product of transconductance of the current sources and a reference (e.g., internally generated) voltage.

DESCRIPTION OF EXAMPLE EMBODIMENTS
OF THE DISCLOSURE

Figure 1A:
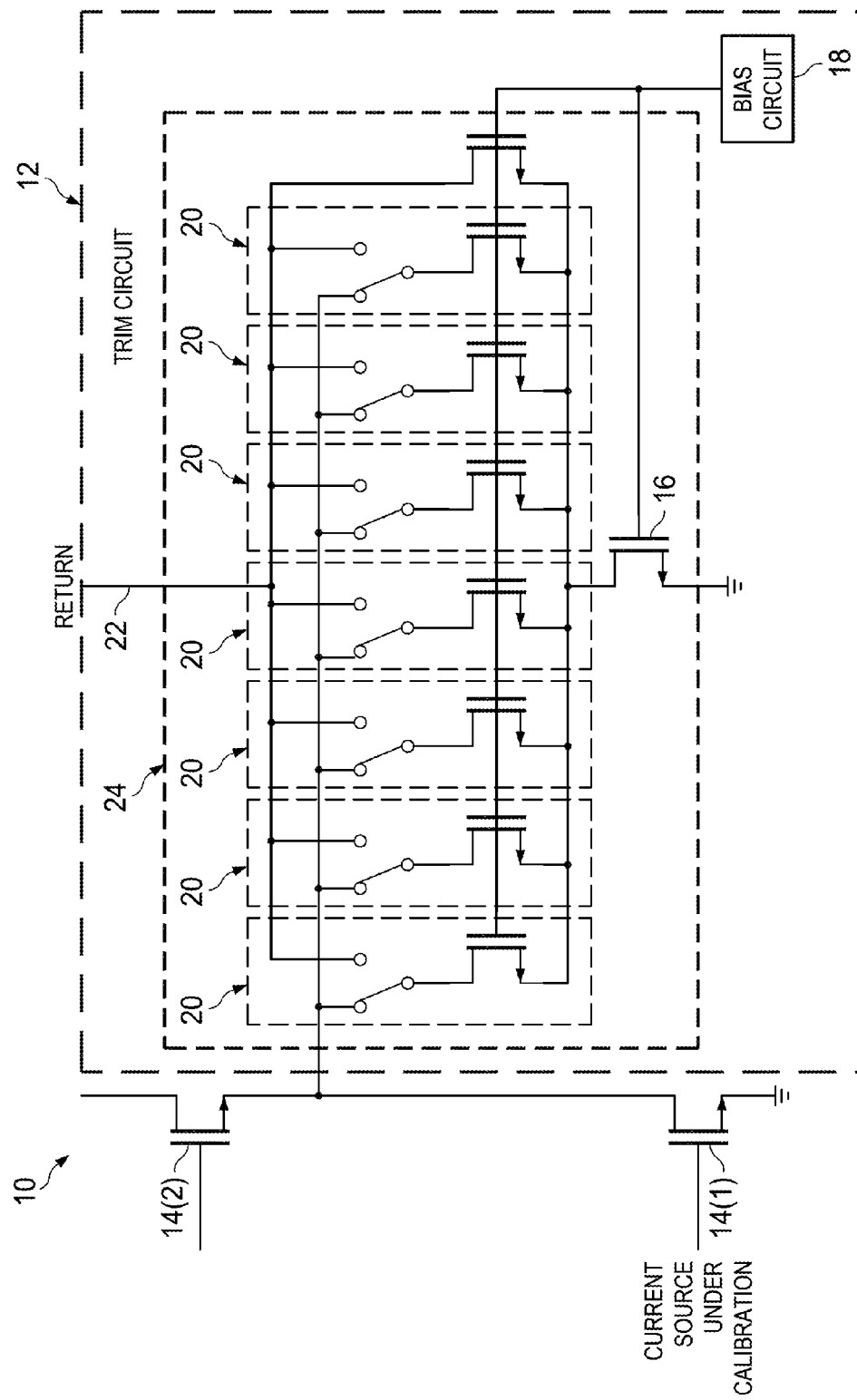
FIG. 1A is a simplified block diagram illustrating an example schematic of a system comprising a trim circuit to facilitate current source calibration tracking temperature and bias current.

FIG. 1A is a simplified block diagram illustrating a system 10 comprising a trim circuit 12 to facilitate current source calibration tracking temperature and bias current. Trim circuit 12 can generate an output current that tracks and compensates for current mismatch between current sources 14(1) and a reference current source (not included in the figure) under varying environmental conditions. In an example embodiment, current source 14(1) may represent a current source under calibration, which can comprise a cascode device 14(2). Trim circuit 12 can include a current source 16 comprising an active electronic component (e.g., transistor). In an example embodiment, the gate voltage of current source 16 is not tied to the gate voltage of one of the external current sources (e.g., 14(1)). A bias circuit 18 generates the gate voltage of current source 16 such that the full scale current of trim circuit 12 is proportional to the product of transconductance ($g_m$) of current source 16 and an internally generated reference voltage $V_{ref}$ (e.g., $g_m(I, T)V_{ref}$). In one example $V_{ref}$ may be a constant factor of a bandgap voltage reference (e.g., temperature and load independent voltage, typically 1.25V).

Each cell 20 of trim circuit 12 may include a portion of a current splitter and a switch configured according to SAR logic (or other suitable logic) to direct the current from current source 16 to either the drain of current source 14(1) (thereby increasing the output current of trim circuit 12) or discarded to a common return current node 22 (e.g., which may be common to substantially all calibration DACs in system 10). Cells 20 and current source 16 may collectively comprise a CAL DAC 24. As used herein, a "CAL DAC" is any suitable digital to analog converter circuit that can be used to calibrate other circuits for various outputs (e.g., current mismatch between two current sources).

In some embodiments, each cell 20 can be switched on or off; current from each cell 20 is aggregated into the output current of trim circuit 12 when the cell is switched on, and current from the cell is diverted away from the output current of trim circuit 12 to return 22 when cell 20 is switched off. In some embodiments, SAR logic may be used to configure each cell to be turned on or off. The on or off position of each cell 20 may be collectively saved to a digital value, called the 'CAL DAC value.' An output of CAL DAC 24 may be proportional to the CAL DAC value.

In many embodiments, trim circuit 12 may behave like a single DAC with its output current tracking transconductance (e.g., $g_m(I,T)\Delta V_{TH}$), which is proportional to bias current and temperature. As temperature T and/or bias current I changes, the current mismatch between current sources 14(1) and the reference current source may change. The output current of trim circuit 12 tracks the transconductance, which varies with temperature T and/or bias current I, and therefore the output current also changes accordingly. Thus, the output current can compensate for increased (or decreased) current mismatch between current sources 14(1) and the reference current source due to varying temperature and/or bias current.

Thus, embodiments of system 10 include current source 14(1) with calibrated trim circuit 12, where an output current of trim circuit 12 varying with transconductance of current source 14(1) and tracking a current mismatch between current source 14(1) and another (e.g., reference) current source under varying bias currents and temperatures. In various embodiments, trim circuit 12 comprises CAL DAC 24 whose output current changes with transconductance of current source 14(1) and tracks the current mismatch under varying bias currents and temperatures.

In some embodiments, bias circuit 18 may comprise a current generator generating current proportional to a bandgap voltage; two substantially identical resistors causing a voltage drop proportional to the current; and a differential transistor pair coupled to the current generator and the two resistors, where gate voltages of the differential transistor pair differ by twice the voltage drop, and an output current of the differential transistor pair (which is a difference between the drain current of the differential transistor pair) is proportional to the transconductance. The current generator may comprise an operational amplifier driving a voltage across a resistor to be a bandgap voltage, such that current across the resistor is proportional to the bandgap voltage. The resistor of the current generator may be substantially similar in type to the two resistors of bias circuit 18.

In some embodiments, bias circuit 18 may generate a gate voltage of current source 16 in trim circuit 12 that can cause a full scale current of CAL DAC 24 to be proportional to the transconductance. In some other embodiments, trim circuit 12 includes CAL DAC 24 connected to a current mirror, which may be connected to a drain of current source 14(1). In a general sense, the "current mirror" is a circuit configured to copy a current through one active device by controlling the current in another active device, keeping the output current constant regardless of loading. In some yet other embodiments, trim circuit 12 may include a voltage DAC connected to a gate of current source 16. The voltage DAC may comprise a plurality of resistors; the output of the voltage DAC may be based on an input digital code.

In some embodiments, trim circuit 12 may comprise a plurality of CAL DACs, where the output current of each CAL DAC changes with transconductance of the current source, where a sum of the output currents of the plurality of CAL DACs tracks the current mismatch under varying bias currents and temperatures. The output pins of the plurality of CAL DACs may be connected to a drain of current source 14(1). In some embodiments, the plurality of CAL DACs may be connected to a drain of current source 14(1) through a current mirror.

In some embodiments, trim circuit 12 may comprise a plurality of CAL DACs, where a portion of the plurality of CAL DACs may provide output currents varying only with bias current; and a remaining portion of the plurality of CAL DACs may provide output currents varying with the transconductance of the current source (e.g., varying with both bias current and temperature), where a sum of the output currents of the plurality of CAL DACs tracks the current mismatch under varying bias currents and temperatures.

In some embodiments, trim circuit 12 comprises at least a first CAL DAC and a second CAL DAC, where a first output current of the first CAL DAC varies with bias current only, and a second output current of the second CAL DAC varies with bias current and temperature. The CAL DAC values of the first and second CAL DACs can be determined through multiple measurements under different bias currents and or temperature. According to some embodiments, a method for calibrating such a trim circuit comprises repeatedly varying calibration settings (e.g., settings of switches in the CAL DAC circuit, for example, that specifies whether the switch is turned on or off) of the first CAL DAC and the second CAL DAC under varying bias currents until an output current of the trim circuit substantially accurately tracks a current mismatch between two current sources under varying bias currents and temperatures.

For example, the method may include setting the second output current to zero, varying calibration settings of the first CAL DAC to force the output current of the trim circuit to match the current mismatch, changing bias current, holding calibration settings of the first CAL DAC at the previously set values while varying calibration settings of the second CAL DAC to force the output current of the trim circuit to match the current mismatch, and sequentially varying calibration settings of the first CAL DAC and the second CAL DAC at different bias currents until the output current of the trim circuit substantially accurately tracks the current mismatch under varying bias currents and temperatures.

In some embodiments, the method may further comprise changing the temperature substantially simultaneously with the bias current and varying calibration settings of the first CAL DAC and the second CAL DAC under varying temperatures until the output current of the trim circuit substantially accurately tracks the current mismatch between two current sources under varying bias currents and temperatures. SAR logic may be used to vary the calibration settings in some embodiments.

Figure 1B:
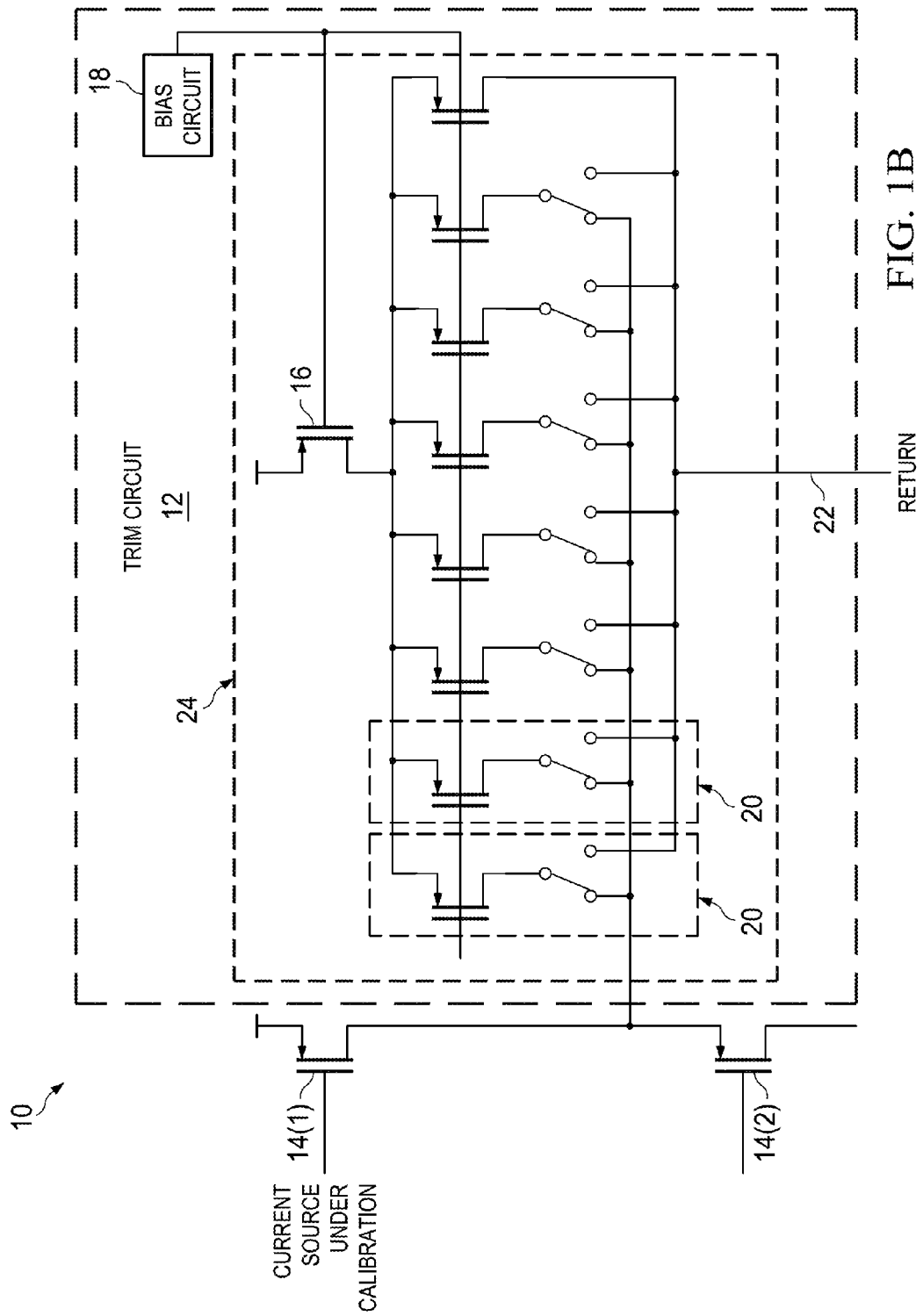
FIG. 1B is a simplified block diagram illustrating another example embodiment of the system.

Turning to FIG. 1B, FIG. 1B is a simplified block diagram illustrating another embodiment of system 10, wherein transistors, including current source 14(1), cascode device 14(2) and current source 16 comprise PMOS transistors. The operations of trim circuit 12 according to the embodiment are virtually identical when the transistors comprise NMOS transistors, as illustrated in the previous FIG. 1A.

Figure 2:
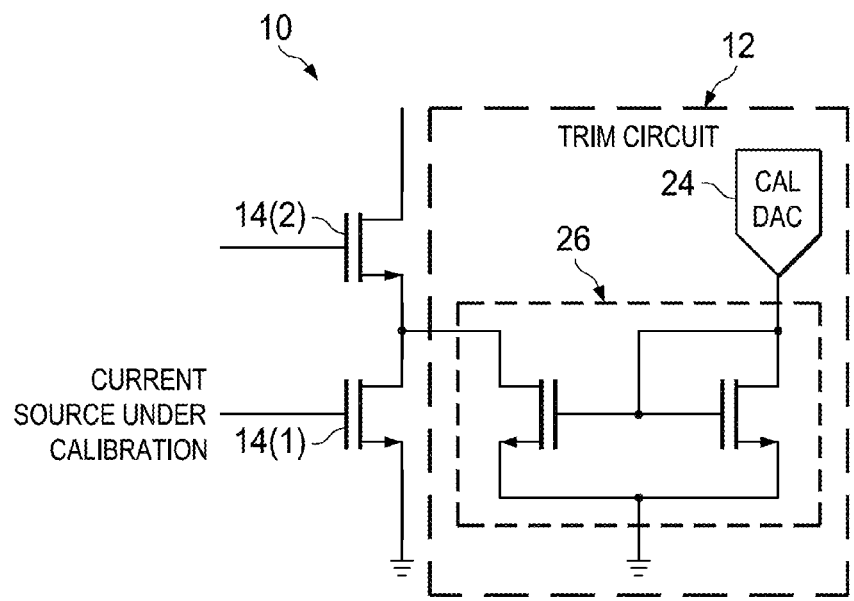
FIG. 2 is a simplified block diagram illustrating example details of an embodiment of the system.

Turning to FIG. 2, FIG. 2 is a simplified block diagram illustrating example details of trim circuit 12 according to another embodiment of system 10. Trim circuit 12 includes CAL DAC 24 (e.g., comprising switches and trim circuits that can be turned on according to SAR logic). CAL DAC 24 may be driven by a bias circuit (not shown) which can generate current proportional to transconductance (e.g., $g_m V_{ref}$) of current source 14(1). Thus, the full scale current of CAL DAC 24 may be proportional to transconductance. Trim circuit 12 also includes a current mirror 26. Current mirror 26 is not limited to the simple circuit shown in the figure and can be any type of current mirror according to the broad scope of the embodiments. The CAL DAC value of CAL DAC 24 can be determined through generally known methods to be a suitable fraction of the full scale current. In some embodiments, the transistors of current mirror 26 can be configured (e.g., designed) to affect the current output from current source 16 within CAL DAC 24, for example, based on the CAL DAC value.

Figure 3:
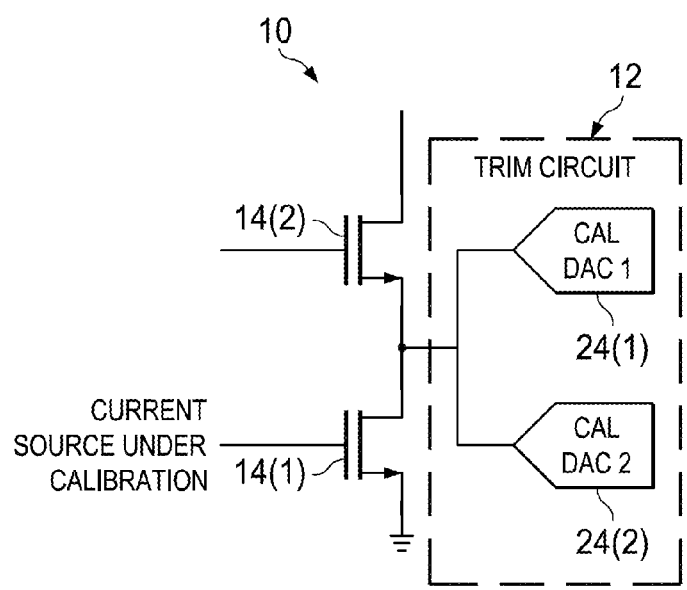
FIG. 3 is a simplified block diagram illustrating other example details of an embodiment of the system.

Turning to FIG. 3, FIG. 3 is a simplified block diagram illustrating example details of trim circuit 12 according to another embodiment of system 10. Trim circuit 12 can include a plurality of CAL DACs 24(1)-24(N), with each CAL DAC having a different environmental dependence. For the sake of simplicity, two CAL DACs 24(1) and 24(2) are shown in the figure. CAL DAC 24(1) may be driven by a bias circuit (not shown) which can generate current proportional to transconductance (e.g., $g_m V_{ref}$) of current source 14(1). Thus, the full scale output current of CAL DAC 24(1) may be proportional to transconductance. In some embodiments, output current of CAL DAC 24(2) may also vary with transconductance. In other embodiments, output current of CAL DAC 24(2) may vary only with bias current. Various other environmental dependencies may be included within the broad scope of the embodiments.

Figure 4:
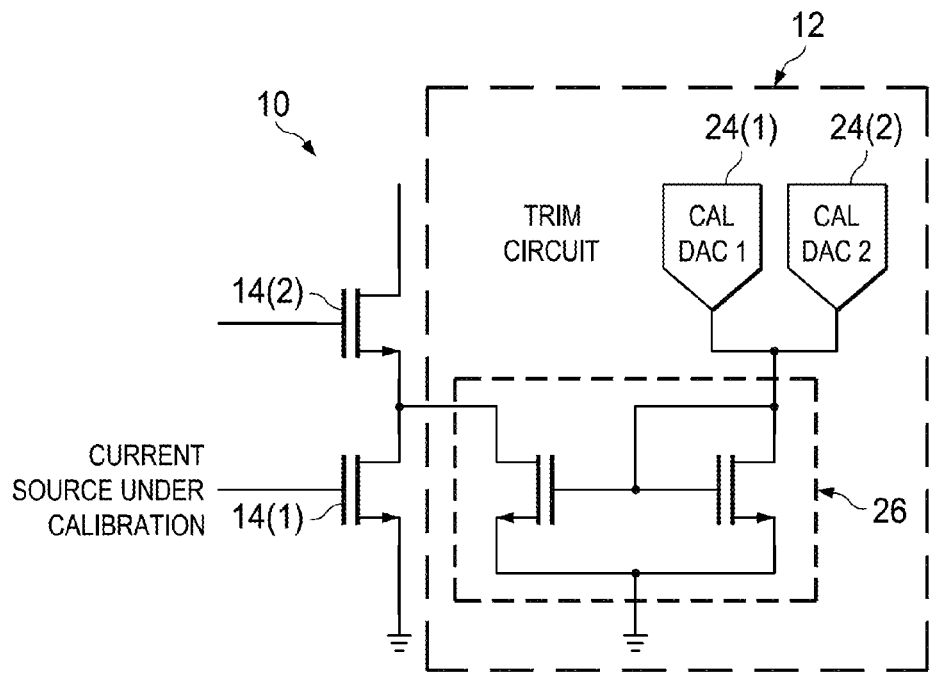
FIG. 4 is a simplified bock diagram illustrating yet other example details of an embodiment of the system.

Turning to FIG. 4, FIG. 4 is a simplified block diagram illustrating example details of trim circuit 12 according to another embodiment of system 10. Trim circuit 12 can include two CAL DACs 24(1) and 24(2), and current mirror 26. The full scale current of CAL DAC 24(1) may be proportional to bias current I, for example, to track $$\frac{\Delta \beta}{\beta} I,$$

whereas the full scale current of CAL DAC 24(2) may be proportional to $g_m V_{ref}$, for example, to track $g_m \Delta V_{TH}$. In some embodiments, CAL DAC 24(2) may be driven by bias circuit 18 (not shown) that generates current proportional to the transconductance. Current mirror 26 may feed a sum of output currents of CAL DACs 24(1) and 24(2) to current source 16. Current mirror 26 is not limited to the simple circuit shown in the figure and can be any type of current mirror according to the broad scope of the embodiments.

Figure 5:
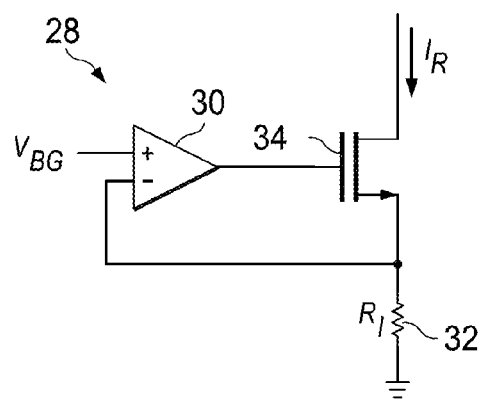
FIG. 5 is a simplified block diagram illustrating yet other example details of an embodiment of the system.

Turning to FIG. 5, FIG. 5 is a simplified block diagram illustrating example details of a current generator 28 according to an embodiment of system 10. $V_{BG}$ is the bandgap voltage generated by external circuitry (not shown). Voltage across resistor 32 (whose resistance is $R_I$) is fixed to $V_{BG}$ by op amp 30. Therefore, $I_R$, current through resistor 32, is $V_{BG}/R_I$. Note that although one example circuit and related components have been illustrated herein, various other circuits and components can be used to achieve the functionalities described herein within the broad scope of the embodiments.

Figure 6:
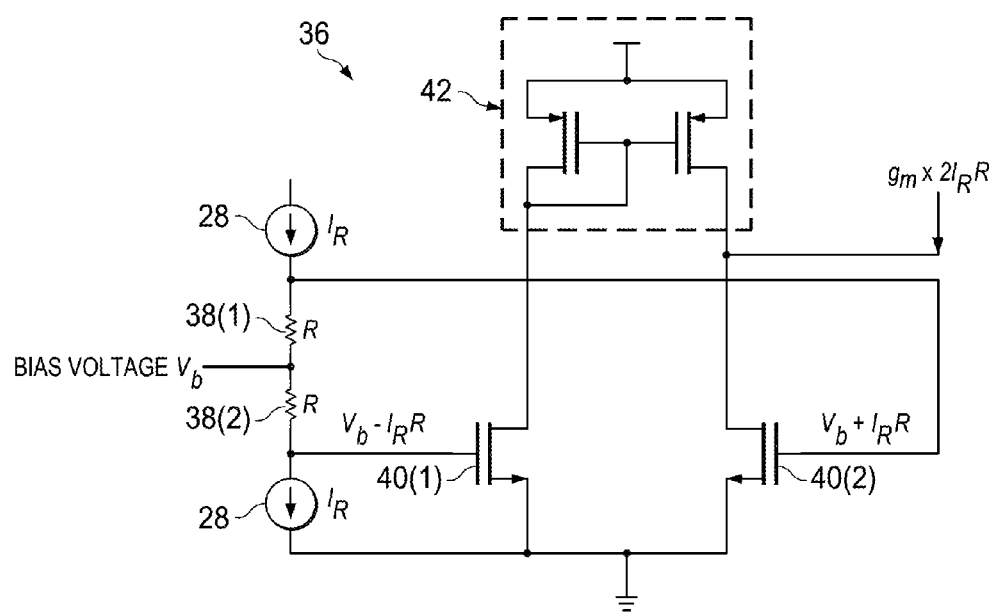
FIG. 6 is a simplified block diagram illustrating yet other example details of an embodiment of the system.

Turning to FIG. 6, FIG. 6 is a simplified block diagram illustrating a circuit 36 configured to generate output current proportional to $g_m V_{ref}$ according to an embodiment of system 10. Current generator 28 generating current $I_R$ can be copied by a current mirror suitably, with a bias voltage $V_b$ applied between the two current generators 28. Resistors 38(1) and 38(2) may comprise a same type of resistor, having resistance R. In various embodiments, resistors 38(1) and 38(2) may comprise the same type of resistor as resistor 32, which is used in current generator 28. Thus, a ratio of resistances, namely $R/R_I$ may be invariant with temperature and a constant in various environments. In an example embodiment, the internally generated reference voltage $V_{ref}$ may be defined to be two times the bandgap voltage $V_{BG}$ and ratio of the resistances R and $R_I$:

$$V_{ref} = 2I_R R = 2V_{BG} \frac{R}{R_I}.$$

A differential transistor pair comprising transistors 40(1) and 40(2), along with an appropriate current mirror biasing stage 42 may be included in circuit 36. Note that the differential transistor pair with its current-mirror biasing stage may be made from matched-pair devices to minimize imbalances from one side of the differential transistor pair to the other. The gate voltages of differential transistor pair 40(1) and 40(2) may be $V_b - I_R R$ and $V_b + I_R R$, respectively, where $V_b$ is the bias voltage. The output current, which may be accessed at current mirror 42, is a difference between the drain current of the differential pair 40(1) and 40(2). The difference in drain current is $g_m V_{ref}$, where $g_m$ is the transconductance of transistor 40(1).

Figure 7:
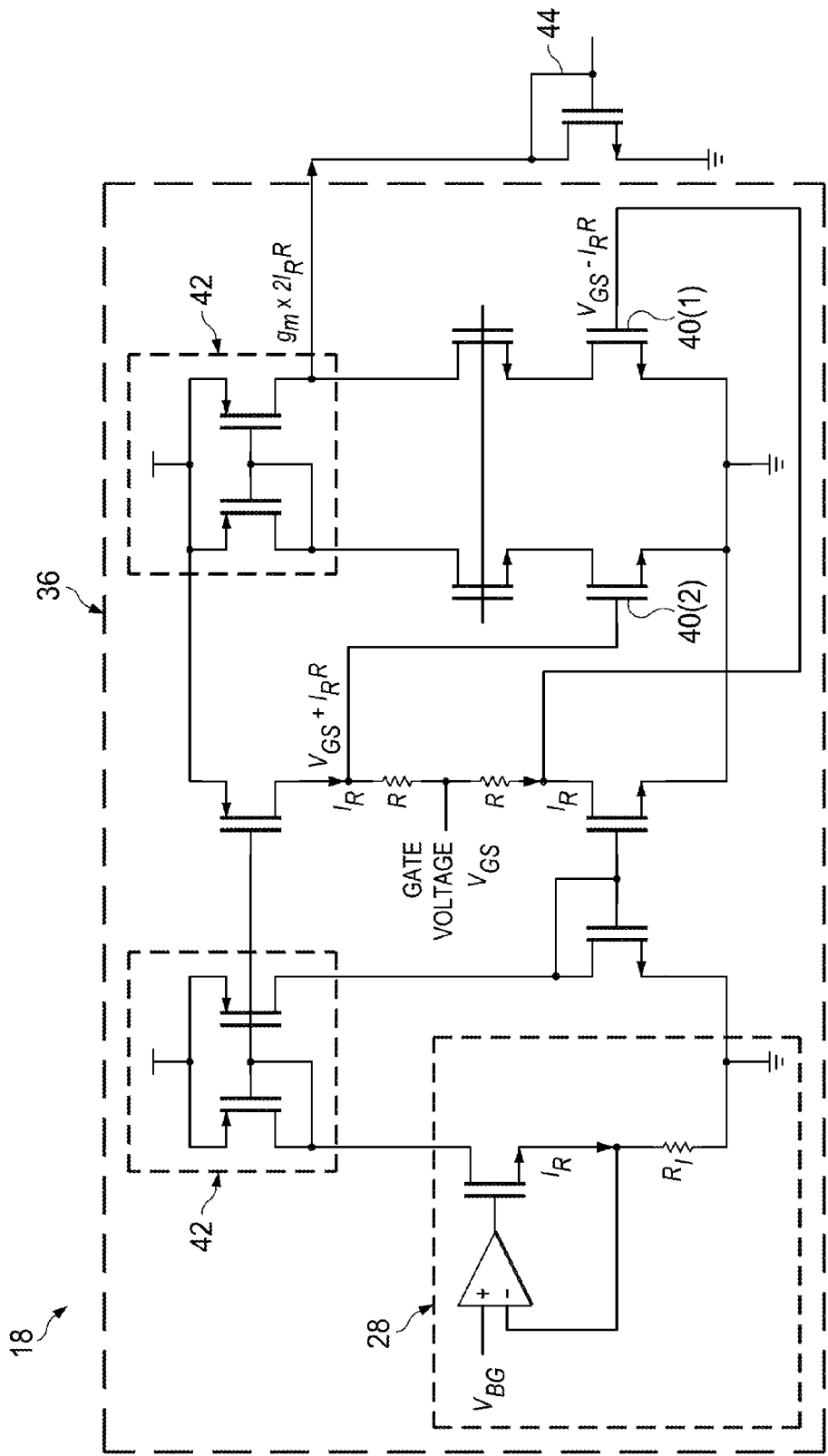
FIG. 7 is a simplified block diagram illustrating yet other example details of an embodiment of the system.

Turning to FIG. 7, FIG. 7 is a simplified block diagram illustrating details of an example bias circuit 18 according to an embodiment of system 10. Circuit 36 configured to generate output current proportional to $g_m V_{ref}$ may be connected to a diode 44 to generate a voltage (e.g., $V_{cal}$) that can force the output current of CAL DAC 24 to be proportional to transconductance and $V_{ref}$ (e.g., $g_m V_{ref}$). Note that a body diode comprising a MOSFET is used for diode 44 in the figure; however, any suitable generic diode or other component that blocks current in one direction can be used within the broad scope of the embodiments. Current generator 28 may be included in circuit 36 with appropriate current mirrors 42 and other transistors suitably to supply current $I_R$ to differential transistor pair 40(1) and 40(2). Note that current proportional to $g_m V_{ref}$ flows out of bias circuit 18 according to the example embodiment shown herein. Various other combinations of components can also be used to achieve the functionalities described herein within the broad scope of the embodiments.

Figure 8:
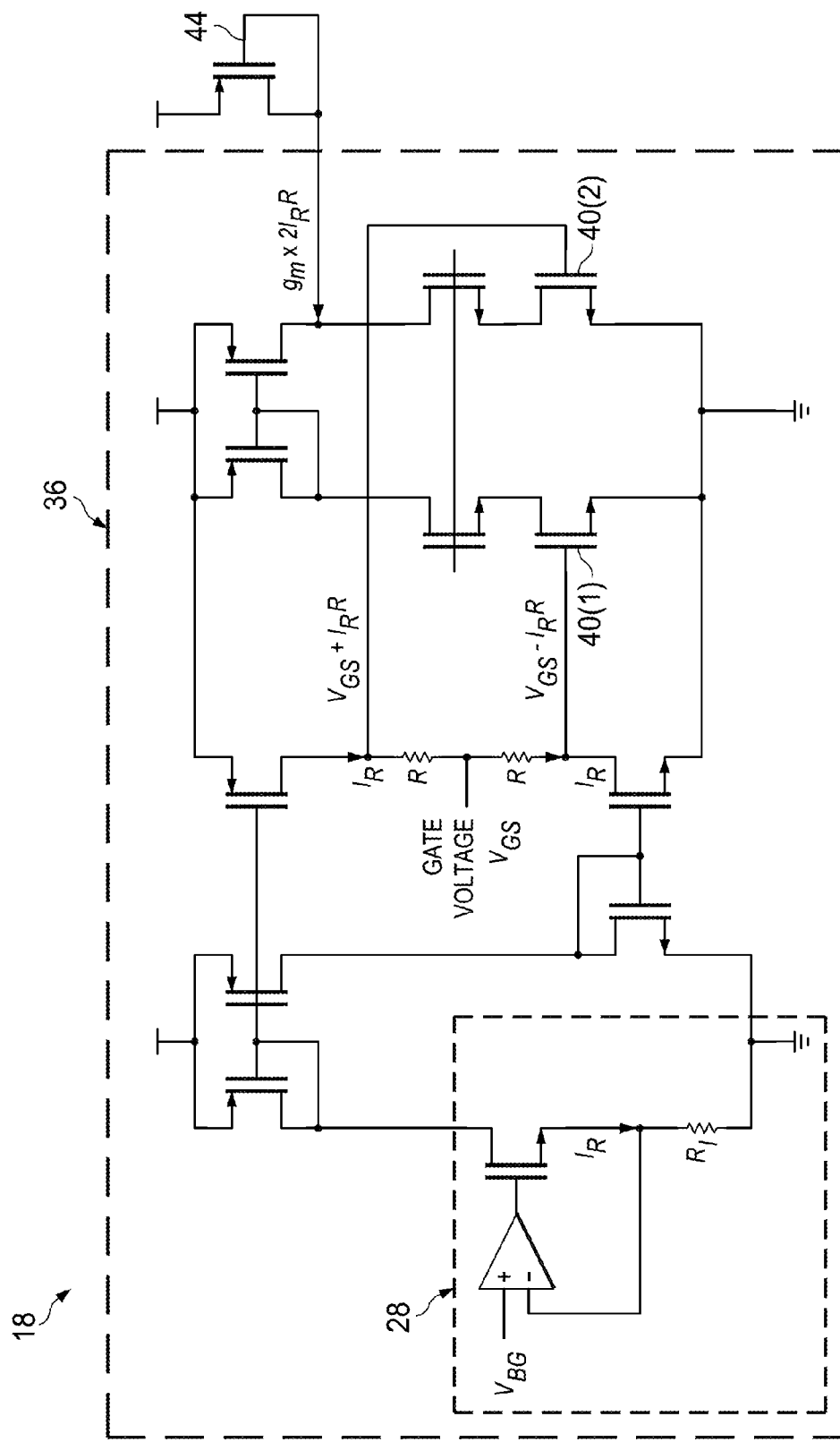
FIG. 8 is a simplified block diagram illustrating yet other example details of an embodiment of the system.

Turning to FIG. 8, FIG. 8 is a simplified block diagram illustrating details of another example bias circuit 18 according to another embodiment of system 10. Circuit 36 configured to generate output current proportional to $g_m V_{ref}$ may be connected to a diode 44 to generate a voltage (e.g., $V_{cal}$) that can force the output current of trim circuit 12 to be proportional to transconductance and $V_{ref}$ (e.g., $g_m V_{ref}$), for example, when CAL DAC 24 is connected to current source 16 within trim circuit 12, and the output therefrom is directly connected to the drain of current source 14(1). Note that a body diode comprising a MOSFET is used for diode 44 in the figure; however, any suitable generic diode or other component that blocks current in one direction can be used within the broad scope of the embodiments.

Current generator 28 may be included in circuit 36 with appropriate current mirrors 42 and other transistors suitably to supply current $I_R$ to differential transistor pair 40(1) and 40(2). Note that the gate voltages of transistors 40(1) and 40(2) are swapped when compared to the embodiment described with reference to the previous figure. Note that current proportional to $g_m V_{ref}$ flows into bias circuit 18 according to the example embodiment shown herein. Various other combinations of components can also be used to achieve the functionalities described herein within the broad scope of the embodiments.

Figure 9:
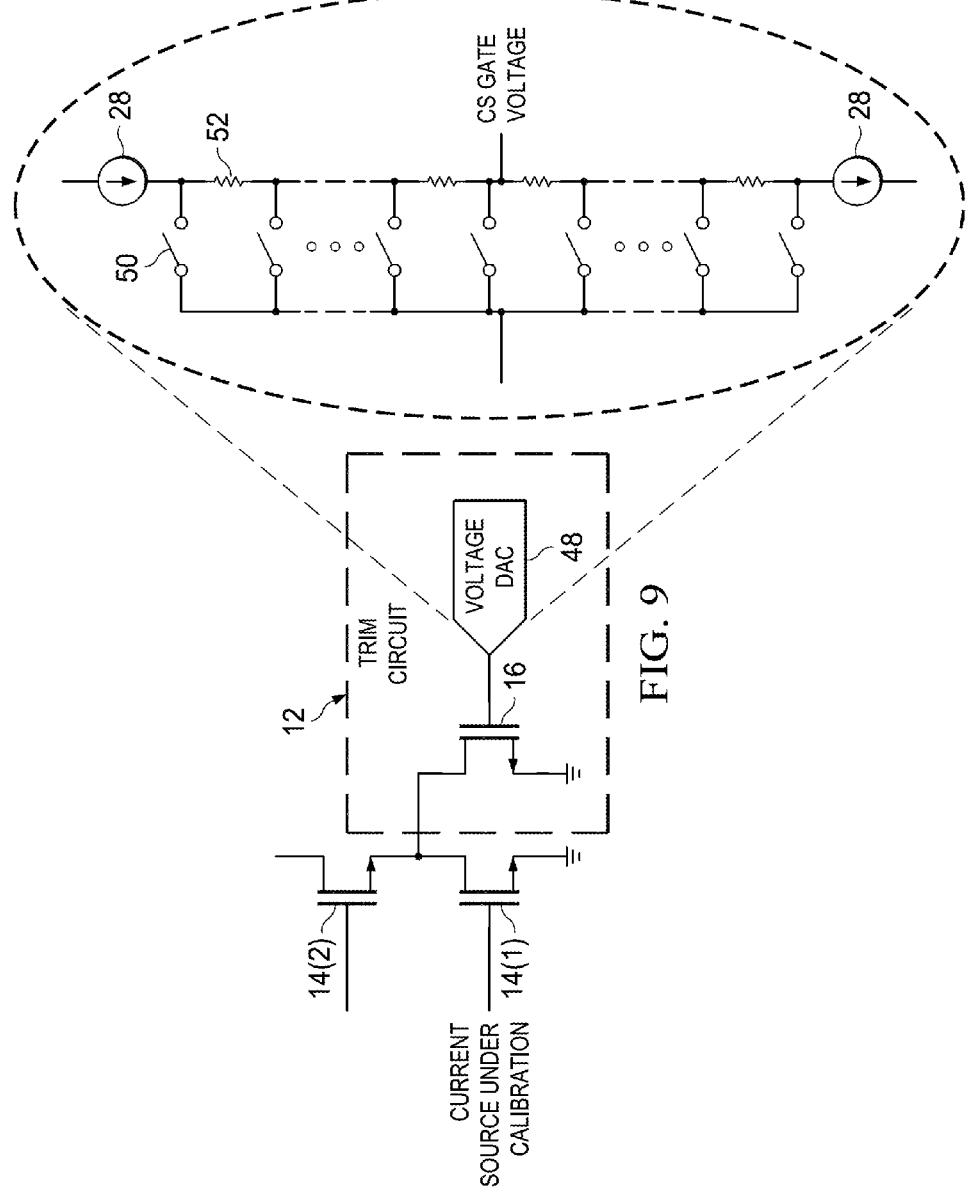
FIG. 9 is a simplified block diagram illustrating yet other example details of an embodiment of the system.

Turning to FIG. 9, FIG. 9 is a simplified diagram illustrating an example CAL DAC 24 (and other details) according to an embodiment of system 10. Trim circuit 12 may comprise a voltage DAC 48 driven by current generator 28. The gate of transistor 16 may be connected to voltage DAC 48 whose output is a voltage based on a digital input. Voltage DAC 48 may comprise a resistor string including switches 50 and resistors 52. Current generated by current generator 28 flowing through the resistor string may generates different voltages at each internal resistor's nodes. Therefore the voltage drop across the resistors may be proportional to the bandgap voltage ($V_{ref}$) and may be constant. A digital input may control switch 50, select a voltage and output the voltage (proportional to $V_{ref}$). Therefore the current of transistor 16 may be $g_m V_{voltageDAC} \cdot g_m$ (where $g_m$ is transconductance of transistor 16, and $V_{voltageDAC}$ is the output voltage of voltage DAC 48) is designed to be proportional to gm of current source 14(1); thus trim circuit may generate a current proportional to $g_m V_{ref}$.

Turning to FIGS. 10A-10D, FIGS. 10A-10D are simplified diagrams illustrating certain operational details of calibrating trim circuit 12 according to an embodiment of system 10. If m CAL DAC values are to be determined, at least m data points may be required. At least m measurements may be performed under m different environments such as different temperature or bias current to obtain at least m data points. Changing temperature can be time consuming, costly and probably impractical for production test. Changing bias currents is more preferable for testing. Thus, the m CAL DAC values can be extracted from the m measurements.

Assume that trim circuit 12 comprises at least two CAL DACs 24(1) and 24(2). Assume, merely as an example, and not as a limitation that the output current of CAL DAC 24(1) varies with the bias current I, and the output current of CAL DAC 24(2) varies with $g_m V_{ref}$ (and thus varies with both temperature and bias current). Thus, a unit current of CAL DAC 24(1) is $U_1 \propto I$, and a unit current of CAL DAC 24(2) is $U_2 \propto g_m V_{ref}$. The current mismatch between the reference current source (e.g., 14(1)) and the current source to be calibrated (e.g., 14(2)) is $$\Delta I(I, T) = \frac{\Delta \beta}{\beta} I - g_m(I, T) \Delta V_{TH}$$

and can be expressed as:

$$\Delta I(I, T) = X_1 U_1(I) + X_2 U_2(I, T), \text{ where } X_1 = \frac{\frac{\Delta \beta}{\beta} I}{U_1(I)}$$

-continued $$\text{and } X_2 = -\frac{g_m \Delta V_{TH}}{U_2(I, T)}$$

For example, assume that the unit current of CAL DAC 24(1) $U_1 \propto I$ is 300 nA and the unit current of CAL DAC 24(2) $U_2 \propto g_m V_{ref}$ is 200 nA under certain operating conditions. Assume that the current mismatch, $$\Delta I(I, T) = \frac{\Delta \beta}{\beta} I - g_m(I, T) \Delta V_{TH},$$

where $$\frac{\Delta \beta}{\beta} I$$

is 1.2 uA and $-g_m(I, T)\Delta V_{TH}$ is 2 uA. In various embodiments, the CAL DAC values may be configured to match with the current mismatch; thus, CAL DAC value of $$\text{CAL DAC } 24(1) \ X_1 = \frac{\frac{\Delta \beta}{\beta} I}{U_1(I)} = 4$$

and CAL DAC value of $$\text{CAL DAC } 24(2) \ X_2 = -\frac{g_m \Delta V_{TH}}{U_2(I, T)} = 10.$$

The calibration method includes an initial cycle and n subsequent cycles n, which can be any number. Each cycle can include at least three steps (e.g., operations). Assume that $C_{10}$ and $C_{20}$ are CAL DAC values of CAL DACs 24(1) and 24(2), respectively after the initial cycle and $C_{1n}$ and $C_{2n}$ are CAL DAC values of CAL DACs 24(1) and 24(2), respectively after the n-th cycle. Assume further that a residue error of CAL DAC 24(2) is defined as $$R_{2n} = 1 - \frac{C_{2n}}{X_2}$$

after n-th cycle. After calibration, the CAL DAC values $C_{1n}$ and $C_{2n}$ may be equal to $X_1$ and $X_2$, respectively and $R_{2n}$ may approach 0.

Figure 10A:
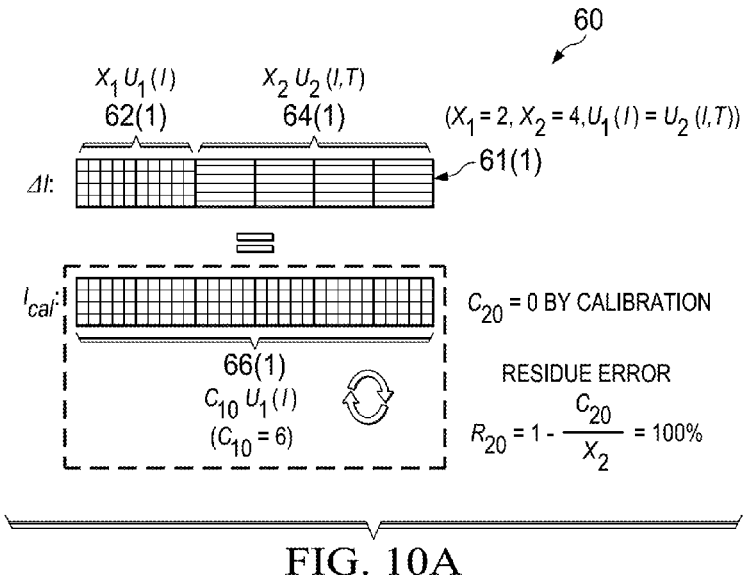
FIGS. 10A, 10B, 10C and 10D are simplified block diagrams illustrating yet other example details of an embodiment of the system.

In initial step 60 as indicated in FIG. 10A, $C_{20}$ is set to be 0 and only CAL DAC 24(1) is calibrated to generate an output current equal to a target current mismatch. Note that $C_{20}$ is set to 0 merely for convenience; $C_{20}$ can be set to any suitable value based on particular needs. An example embodiment may implement SAR logic as a possible way for measurement. $R_{20}$ is 100% after the initial cycle. CAL DAC 24(1)'s contribution to current mismatch $\Delta I$ 61(1) between current sources 14(1) and 14(2) is denoted as current contribution 62(1) and CAL DAC 24(2)'s contribution to current mismatch $\Delta I$ is denoted as current contribution 64(1). The output current of trim circuit 12 may be denoted as $I_{cal}$ 66(1). Ideally, $I_{cal}$ 66(1) would be equal to current mismatch $\Delta I$ 61(1), and when both CAL DAC 24(1) and CAL DAC 24(2) are calibrated appropriately to varying bias current and temperature, $I_{cal}$ 66(1) may include appropriate contributions from CAL DAC 24(1) and CAL DAC 24(2). In initial cycle 60, the CAL DAC value of CAL DAC 24(1), namely, $C_{10}$, may be set (e.g., configured, determined, established, estimated, approximated, etc., based on SAR logic or other suitable logic) to obtain $I_{cal}$ 66(1) while holding the output current of CAL DAC 24(2) ($C_{20}$) at 0.

Figure 10B:
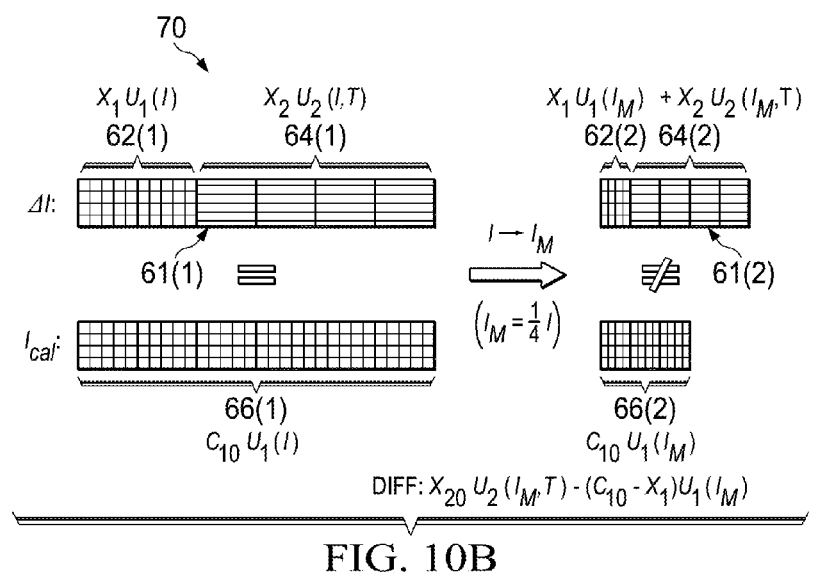

In next step 70 as shown in FIG. 10B, the current source bias current may change from I to $I_M$ and the temperature may be kept constant or ignored (e.g., temperature can vary without affecting the results). $U_1(I)$ and $U_2(I,T)$ can change differently (e.g., because of their different dependencies on bias current). As a result, CAL DAC 24(1)'s contribution to current mismatch $\Delta I$ 61(2) between current sources 14(1) and 14(2) may be changed to current contribution 62(2) and CAL DAC 24(2)'s contribution to current mismatch $\Delta I$ 61(2) may be changed to current contribution 64(2); $I_{cal}$ 66(2) may also be reduced to $C_{10}U_1(I_M)$ and the may no longer be equal to $I_{cal}$ 66(1). Assume that $U_1(I_M)=\alpha_1 U_1(I)$ and $$U_2(I_M, T_M) = \alpha_2 U_2(I, T), \ \frac{\alpha_1}{\alpha_2} < 1.$$

The difference between the current mismatch $\Delta I$ 61(2) and the target mismatch $I_{cal}$ 66(2) in step 70 is:

$$X_2 U_2(I_M, T) - (C_{10} - X_1) U_1(I_M)$$

Figure 10C:
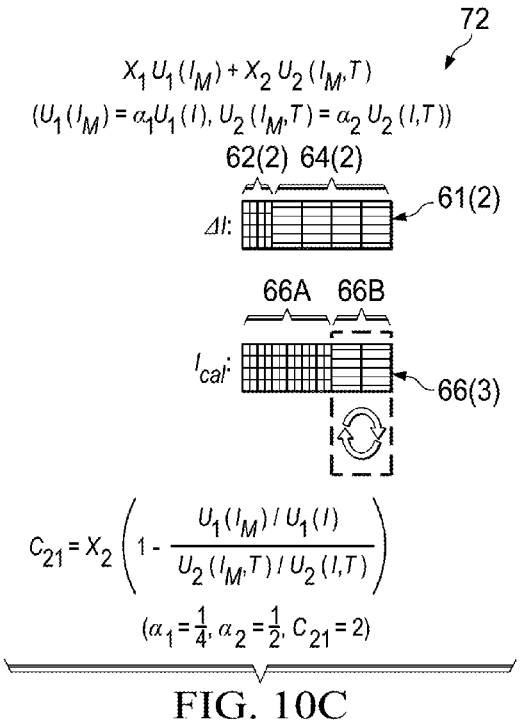

In next step 72, as shown in FIG. 10C, CAL DAC value of CAL DAC 24(1) may be held to be $C_{10}$. Thus, contribution of CAL DAC 24(1) to $I_{cal}$ 66(3) may be indicated as 66A, and may remain equal to $I_{cal}$ 66(2) from previous step 70. Only CAL DAC 24(2) may be used in the calibration measurement to force $I_{cal}$ 66(3) to equal current mismatch $\Delta I$ 61(2). For example, CAL DAC value of CAL DAC 24(2) may be determined through SAR logic (or other suitable logic) to get an output current 66B, which when added to 66A, results in $I_{cal}$ 66(3) being equal to current mismatch $\Delta I$ 61(2). The CAL DAC value of CAL DAC 24(2) is:

$$C_{21} = X_2 \left(1 - \frac{U_1(I_M)/U_1(I)}{U_2(I_M, T)/U_2(I, T)}\right)$$

When $\alpha_1 = \frac{1}{4}$, and $\alpha_2 = \frac{1}{2}$, $C_{21} = 2$.

Figure 10D:
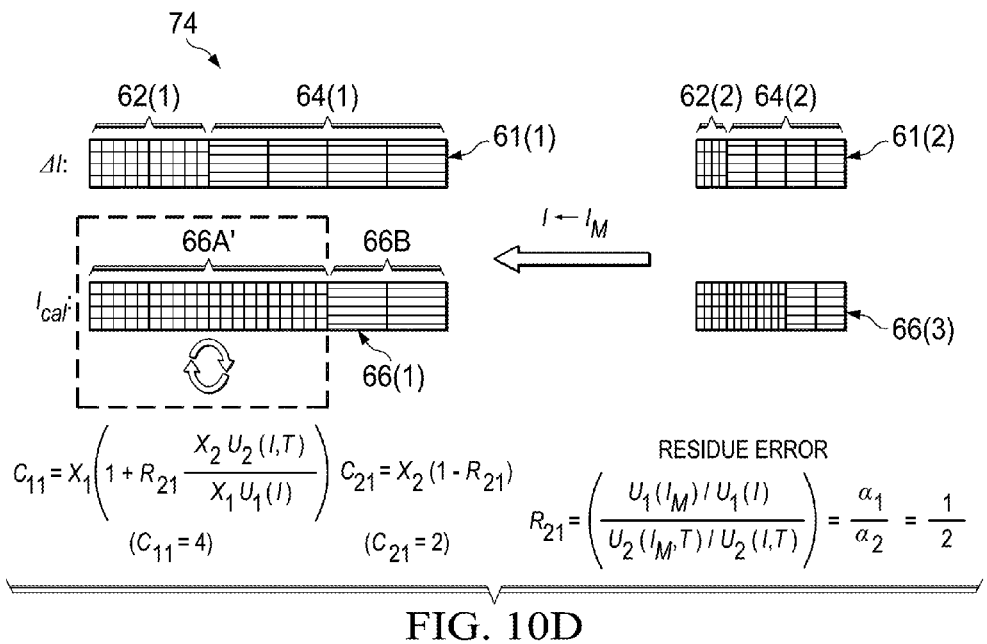

In next step 74, as shown in FIG. 10D, the current source current may be restored to I. As a result, current mismatch $\Delta I$ 61(2) may revert back to current mismatch $\Delta I$ 61(1); CAL DAC 24(1)'s contribution to current mismatch $\Delta I$ 61(1) may revert back to current contribution 62(1); and CAL DAC 24(2)'s contribution to current mismatch $\Delta I$ 61(1) may revert back to current contribution 64(1). CAL DAC value of CAL DAC 24(2) may be held to be $C_{21}$, thereby fixing contribution of CAL DAC 24(2) to $I_{cal}$ 66(1) at 66B, from previous step 72. Configuration settings of CAL DAC 24(1) may be changed appropriately to obtain a CAL DAC value of 66A', which when added to 66B, results in $I_{cal}$ 66(1) being equal to current mismatch $\Delta I$ 61(1). The residue error of CAL DAC 24(2) may be:

$$R_{21} = \left(\frac{U_1(I_M)/U_1(I)}{U_2(I_M, T)/U_2(I, T)}\right) = \frac{\alpha_1}{\alpha_2}$$

-continued $$C_{11} = X_1\left(1 + R_{21}\frac{X_2 U_2(I, T)}{X_1 U_1(I)}\right)$$

$$C_{21} = X_2(1 - R_{21}).$$

It can be observed that $R_{21}$ is reduced and $C_{11}$ and $C_{21}$ are closer to $X_1$ and $X_2$. By repeating steps 70, 72 and 74 for n cycles, residue error of CAL DAC 24(2) may be reduced to:

$$R_{2n} = \left(\frac{U_1(I_M, T)/U_1(I, T)}{U_2(I_M, T)/U_2(I, T)}\right)^n = \left(\frac{\alpha_1}{\alpha_2}\right)^n$$

which approaches 0 towards the n-th cycle; $C_{1n}$ and $C_{2n}$ approaches $X_1$ and $X_2$.

In another example embodiment, CAL DAC 24(1) and CAL DAC 24(2) may be swapped in all steps. In some embodiments, the bias current I may be held at a constant value and only temperature T may be changed. In some embodiments, both bias current and temperature may be changes substantially simultaneously.

Figure 11:
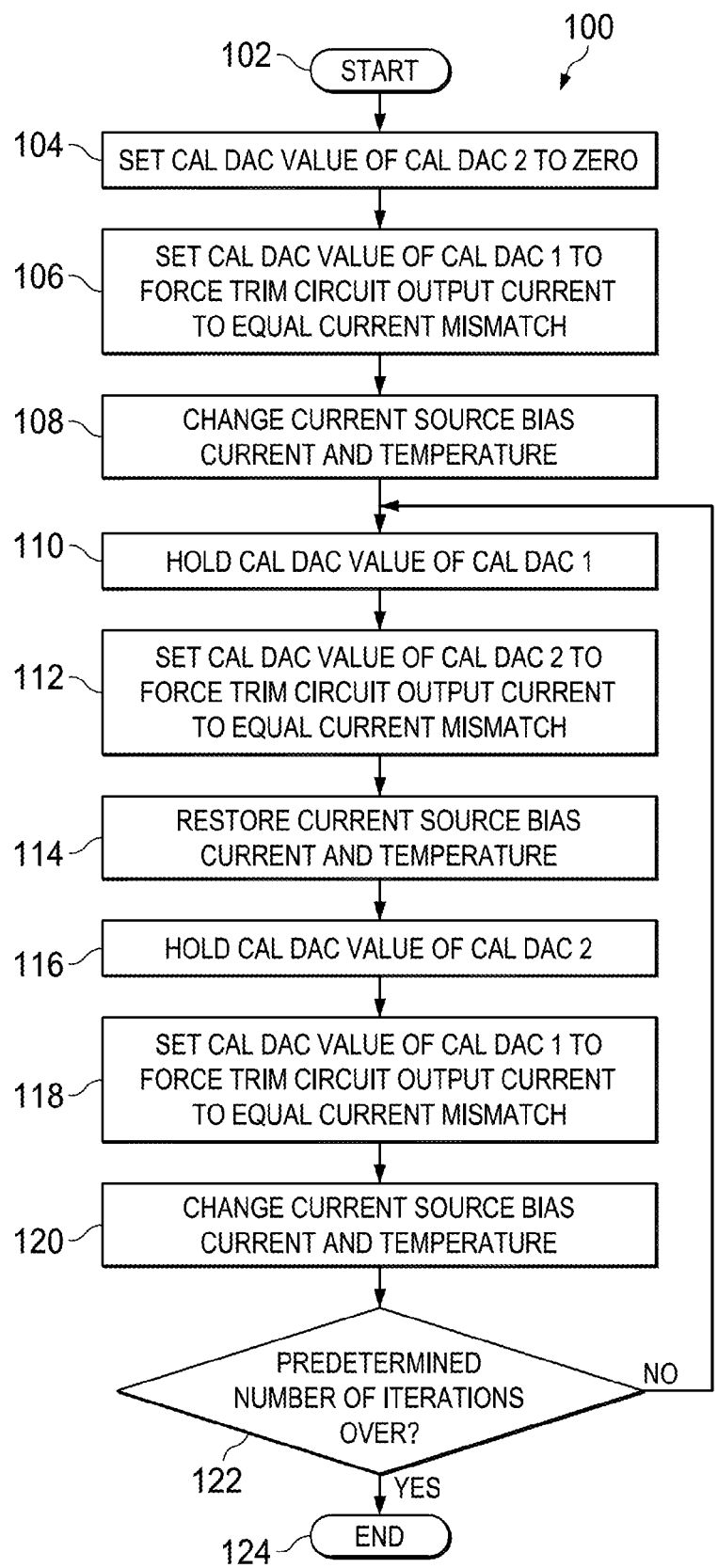
FIG. 11 is a simplified flow diagram illustrating example operations that may be associated with an embodiment of the system.

Turning to FIG. 11, FIG. 11 is a simplified flow diagram illustrating example operations 100 that may be associated with a calibration method according to embodiments of system 10. Assume that trim circuit 12 comprises at least two CAL DACs 24(1) and 24(2). Assume, merely as an example, and not as a limitation that the output current of CAL DAC 24(1) varies with the bias current I, and the output current of CAL DAC 24(2) varies with $g_m V_{ref}$ (and thus varies with both temperature and bias current). The operations may start at 102. At 104, the CAL DAC value of CAL DAC 24(2) may be set to zero. At 106, the CAL DAC value of CAL DAC 24(1) may be determined (e.g., according to SAR logic, or other suitable logic) to force trim circuit output current ($I_{cal}$) to equal current mismatch ($\Delta I$) between current sources 14(1) and 14(2).

At 108, current source bias current (and/or temperature in some embodiments) may be changed. At 110, the CAL DAC value of CAL DAC 24(1) may be held at the previously determined value (at 106). At 112, the CAL DAC value of CAL DAC 24(2) may be determined (e.g., according to SAR logic, or other suitable logic) to force trim circuit output current ($I_{cal}$) to equal current mismatch ($\Delta I$) between current sources 14(1) and 14(2). At 114, the current source bias current (and/or temperature) may be restored to original values. At 116, the CAL DAC value of CAL DAC 24(2) may be held at the previously determined value (at 112).

At 118, the CAL DAC value of CAL DAC 24(1) may be determined (e.g., according to SAR logic, or other suitable logic) to force trim circuit output current ($I_{cal}$) to equal current mismatch ($\Delta I$) between current sources 14(1) and 14(2). At 120, the bias current (and/or temperature) may be changed. A determination may be made at 122 if a predetermined number of iterations is over. If the predetermined number of iterations is over, the operations may end at 124. Otherwise, the operations may loop back to 110, and continue thereafter.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic chips, hardware, software, etc. offer an equally viable option for implementing the teachings of the present disclosure.

In one example embodiment, any number of electrical circuits of the FIGURES may be implemented on a board of an associated electronic chip. The board can be a general circuit board that can hold various components of the internal electronic system of the electronic chip and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and other peripheral chips may be attached to the board as plug-in cards, via cables, or integrated into the board itself.

In another example embodiment, the electrical circuits of the FIGURES may be implemented as stand-alone modules (e.g., a chip with associated components and circuitry configured to perform a specific application or function) or implemented as plug-in modules into application specific hardware of electronic chips. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities as described herein may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of components, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that rely on synchronization signals to execute specialized software programs, or algorithms, some of which may be associated with processing digitized real-time data. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can apply the functionalities described herein in high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the electrical circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media chip). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes, Examples, and Implementations

Note that all optional features of the apparatus described above may also be implemented with respect to the method or process described herein and specifics in the examples may be used anywhere in one or more embodiments. In a first example, a system is provided (that can include any suitable circuitry, dividers, capacitors, resistors, inductors, ADCs, DFFs, logic gates, software, hardware, links, etc.) that can be part of any type of electronic device (e.g., computer), which can further include a circuit board coupled to a plurality of electronic components. The system can include means for calibrating a trim circuit comprising at least a first CAL DAC and a second CAL DAC, including means for varying calibration settings of the first CAL DAC and the second CAL DAC under varying bias currents until an output current of the trim circuit substantially accurately tracks a current mismatch between two current sources under varying bias currents and temperatures, wherein a first output current of the first CAL DAC varies with bias current only, and a second output current of the second CAL DAC varies with bias current and temperature, wherein the output current of the trim circuit is a sum of the first output current and the second output current.

The system can also include means for setting the second output current to zero; means for varying calibration settings of the first CAL DAC to force the output current of the trim circuit to match the current mismatch; means for changing bias current; means for holding calibration settings of the first CAL DAC at the previously set values while varying calibration settings of the second CAL DAC to force the output current of the trim circuit to match the current mismatch; and means for sequentially varying calibration settings of the first CAL DAC and the second CAL DAC at different bias currents until the output current of the trim circuit substantially accurately tracks the current mismatch under varying bias currents and temperatures.

The system can also include means for changing the temperature substantially simultaneously with the bias current; and means for varying calibration settings of the first CAL DAC and the second CAL DAC under varying temperatures until the output current of the trim circuit substantially accurately tracks the current mismatch between two current sources under varying bias currents and temperatures.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. A circuit having current source calibration comprising:
a first current source for delivering input current; and a calibrated trim circuit coupled to a transistor drain of the first current source, the calibrated trim circuit for calibrating the first current source and outputting an output current, wherein the calibrated trim circuit includes:
a bias circuit configured to generate a bias current
wherein the output current varies with the transconductance of the first current source, and
wherein the output current tracks a current mismatch between the first current source and a second current source under varying values of the bias current and varying temperatures.

2. The circuit of claim 1, wherein the trim circuit further comprises a calibration digital to analog converter (CAL DAC), and wherein the CAL DAC comprises a plurality of cells, wherein each of the plurality of cells can be switched on or off, and wherein
when a respective cell of the plurality of cells is switched on, current from the respective cell is aggregated into the output current of the trim circuit, and
when the respective cell is switched off, current from the respective cell is diverted away from the output current of the trim circuit.

3. The circuit of claim 1, wherein the bias circuit comprises:
a current generator generating bias current proportional to a bandgap voltage;
two substantially identical resistors causing a voltage drop proportional to the bias current;
a differential transistor pair coupled to the current generator and the two resistors, wherein gate voltages of the differential transistor pair differ by twice the voltage drop, wherein an output current of the differential transistor pair is a difference between the drain current of the differential transistor pair and is proportional to the transconductance.

4. The circuit of claim 3, wherein the current generator comprises an operational amplifier driving a voltage across a third resistor to 44e-a generate the bandgap voltage, and wherein bias current across the third resistor is proportional to the bandgap voltage.

5. The circuit of claim 1, wherein the trim circuit further includes a calibration digital to analog converter (CAL DAC) having a third current source, and wherein the bias circuit generates a gate voltage of the third current source in the trim circuit, and wherein the gate voltage causes a full scale current of the CAL DAC to be proportional to the transconductance.

6. The circuit of claim 1, wherein the trim circuit further includes a calibration digital to analog converter (CAL DAC) and a current mirror, wherein the current mirror is connected to the CAL DAC and to the drain of the first current source.

7. The circuit of claim 1, wherein the trim circuit further includes a voltage DAC connected to a gate of a fourth current source, wherein the voltage DAC comprises a resistor string, wherein the voltage DAC generates a voltage proportional to a bandgap voltage, wherein an output current of the fourth current source generates a current proportional to the transconductance of the first current source and the bandgap voltage.

8. The circuit of claim 7, wherein the voltage DAC is driven by a current generator, wherein the current generator generates current proportional to the bandgap voltage.

9. The circuit of claim 1, wherein the trim circuit comprises a plurality of CAL DACs, wherein the output current of each CAL DAC changes with the transconductance of the first current source, wherein a sum of output currents of the plurality of CAL DACs tracks current mismatch under varying values of the bias current and varying temperatures.

10. The circuit of claim 9, wherein output pins of the plurality of CAL DACs are connected to the drain of the first current source.

11. The circuit of claim 9, wherein output pins of the plurality of CAL DACs are connected to the drain of the first current source through a current mirror.

12. The circuit of claim 1, wherein the trim circuit further comprises a first and a second calibration digital to analog converter (CAL DAC), wherein a first output current of the first CAL DAC varies with bias current, and a second output current of the second CAL DAC varies with bias current and temperature.

13. The circuit of claim 12, wherein the first current source provides input current to the first CAL DAC and wherein a second current source provides a second input current to the second CAL DAC.

14. The circuit of claim 1, wherein the bias circuit is configured to generate a bias current proportional to a transconductance of the first current source.

15. The circuit of claim 1, wherein the trim circuit further comprises a calibration digital to analog converter (CAL DAC) having a third current source.

16. A trim circuit for calibrating an input current source and outputting an output current, comprising:
a bias circuit configured to generate a bias current proportional to a transconductance of the input current source;
wherein the output current varies with transconductance of the input current source, and
wherein the output current tracks a current mismatch between the input current source and a third current source under varying values of the bias current and varying temperatures.

17. The trim circuit of claim 16, wherein the bias circuit comprises a current generator for generating a bias current proportional to a bandgap voltage.

18. The trim circuit of claim 16, further comprising a calibration digital to analog converter (CAL DAC), and wherein the bias circuit drives the CAL DAC.

19. The trim circuit of claim 18, wherein the CAL DAC comprises a plurality of cells, wherein each of the plurality of cells can be switched on or off, and wherein
when a respective cell of the plurality of cells is switched on, current from the respective cell is aggregated into the output current of the trim circuit, and
when the respective cell is switched off, current from the respective cell is diverted away from the output current of the trim circuit.

20. The trim circuit of claim 16, wherein the trim circuit further comprises a first and a second calibration digital to analog converter (CAL DAC), wherein the current source provides input current to the first CAL DAC and wherein a second current source provides a second input current to the second CAL DAC.

* * * * *